United States Patent [19]
Carlson et al.

[11] 4,263,548
[45] Apr. 21, 1981

[54] MIDPOINT MEASURING CIRCUIT

[75] Inventors: Scott W. Carlson, Blaine; James T. Bartelt, Shoreview, both of Minn.

[73] Assignee: Cardiac Pacemakers, Inc., St. Paul, Minn.

[21] Appl. No.: 87,680

[22] Filed: Oct. 24, 1979

[51] Int. Cl.³ .................... G01R 19/00; G01R 19/16; H03K 5/20
[52] U.S. Cl. .................. 324/102; 307/351; 324/103 P; 328/151
[58] Field of Search ............ 324/102, 103 P; 307/351, 352, 353; 328/150, 151

[56] References Cited
U.S. PATENT DOCUMENTS

| | | | |
|---|---|---|---|
| 2,591,738 | 4/1952 | Spencer | 324/102 |
| 2,624,770 | 1/1953 | Yetter | 324/102 |
| 4,165,508 | 8/1979 | Barter | 307/351 |

*Primary Examiner*—Ernest F. Karlsen

*Attorney, Agent, or Firm*—Orrin M. Haugen; Thomas J. Nikolai

[57] ABSTRACT

Apparatus for measuring the amplitude of an adjustable width current or voltage impulse at a known time interval following the initiation of the impulse. During a first pulse duration, a counter is advanced with clock signals having a frequency $f_1$. The total number of clock signals accumulated during the interval is then transferred into a downcounter which is arranged to be decremented during a second identical interval by a clock signal having a frequency n ($f_1$). When the downcounter reaches zero, a strobe pulse is produced for enabling the analog measuring circuits which sample the amplitude of the current or voltage impulse being monitored. By selecting the value n, the sampling point can be shifted in time along the width of the pulse being measured. For example, for n=2, the amplitude of the voltage or current pulse being measured will be that occurring at the midpoint of the pulse.

7 Claims, 4 Drawing Figures

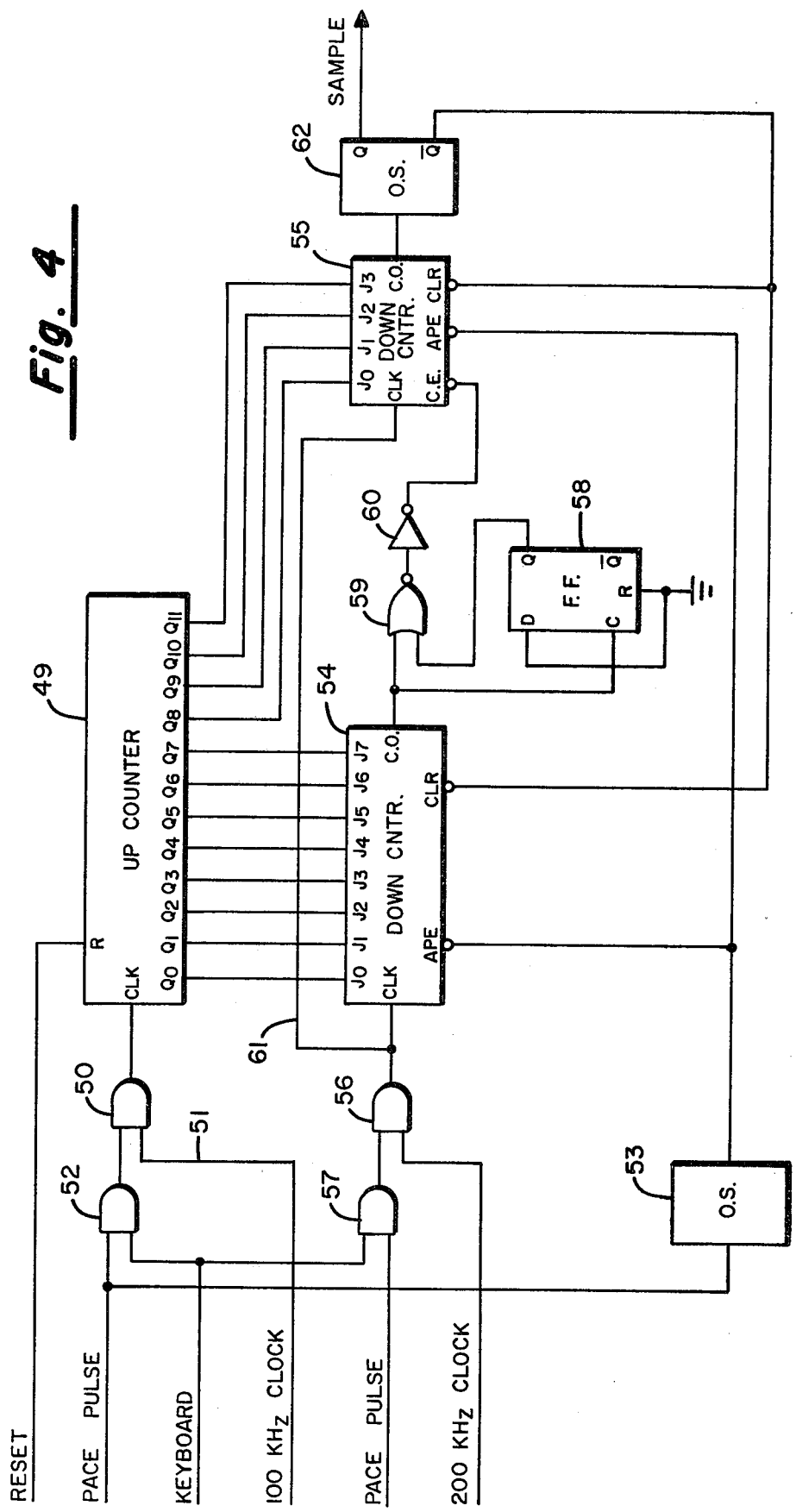

MIDPOINT MEASURING CIRCUIT

BACKGROUND OF THE INVENTION

I. Field of the Invention

This invention relates generally to electronic test apparatus for measuring the output signal characteristics of a pulse generator, and more specifically to the design of a circuit which permits voltage or current impulses of a variable duration and unknown amplitude to have their amplitude measured at a desired location along the time axis thereof.

II. Discussion of the Prior Art

In known prior art voltage and current amplitude test apparatus it is the usual practice to measure the peak current or voltage magnitude. Typically, where square wave pulses are involved, it is usual that the leading edge of the pulse will be of a greater amplitude than the trailing edge with a characteristic exponential droop exhibited between the leading edge and the trailing edge. In many instances, a person is more interested in knowing the average current or voltage amplitude than he is in knowing the peak amplitude. As such, more meaningful information is obtained if the measurement is made at a point along the time axis which is between the leading and trailing edge, e.g., at the midpoint of the pulse width.

As will be set out in greater detail hereinbelow, the present invention was specifically conceived for use in a hand-held, portable, battery powered test instrument useful in evaluating the performance of cardiac pacing devices and in determining pre-implant threshold data. The test instrument is adapted to be coupled to a cardiac pacer pulse generator so as to receive the output pulses from the pulse generator. In evaluating battery power consumption, it is much more meaningful to know the average current amplitude of the pacer pulse rather than the peak amplitude. The same comment holds true with respect to voltage measurements and resistance measurements. That is to say, by sampling the voltage and current amplitudes of pacer pulses at, for example, the midpoint of the impulse, the readings prove to be more representative of the average values than is true when leading edge measurements are employed. In that the resistance seen by the pulse generator is obtained by dividing the voltage by the current, a midpoint reading proves to be more meaningful. Then too, the resultant current at the midpoint is generally lower in each case than it is at its leading edge and is also more representative of the pulse generator's average current drain during pacing. As such, the user is more able to measure and predict battery life knowing the pacer's average operating characteristics as distinguished from its peak characteristics.

SUMMARY OF THE INVENTION

In the test instrument in which the present invention finds use, there is provided a keyboard having a number of push button switches as well as a series of control knobs for manually adjusting potentiometer settings governing such things as pulse rate, width, amplitude, etc. It further includes an alphanumeric display panel where the results of various measurements selected by the aforementioned push botton switches may be presented for visual observation by the user. The test instrument not only may be used to measure the operating parameters of an external pulse generator, such as an implantable cardiac pacer or the like, but also includes an internal pulse generator for producing variable amplitude, rate and width impulses for applicatin to a patient to determine threshold data while the implant surgery is in progress. Finally, the device includes means for non-invasively measuring the rate, width and interval between pulses of an implanted pacemaker system by picking up the electrical potentials from the skin surface of the patient and applying those potentials to the test instrument by way of suitable skin contacting electrodes and leads.

When operating in the first mode, i.e., as a device for testing an external pacer prior to implant, the output from the pacer under test is applied to the test instrument of the present invention by way of suitable leads and appropriate keyboard push botton switches are depressed. Operating through a signal conditioner circuit, a strobe pulse may be developed at the midpoint (or at some other preselected point) of the output pulse from the pacer under test and this strobe signal is used to turn on analog voltage, current or resistance measuring circuits, depending which of the particular push botton switches had originally been depressed. The output from the analog measurement circuits are coupled through an analog-to-digital converter and from there to a digitl display such that the magnitude of the parameter being measured is presented. Because of the arrangement employed, this measurement corresponds to the amplitude of the sampled waveform at its midpoint.

To obtain this strobe signal, a first counter is used which is adapted to be advanced at a frequency $f_1$ for the duration of the impulse being measured. The total accumulated in this first counter is then transferred into a downcounter which is arranged to be decremented during an identical period by a clock signal having a frequency $n\, f_1$. When the downcounter reaches zero, the strobe pulse in question is generated for use by the analog measuring circuit selected by the push button switch panel. When, for example, the downcounter is decremented at twice the rate at which the up-counter is incremented, its contents will reach zero in half the time, which corresponds to the midpoint of the original waveform.

OBJECTS

It is accordingly the principal object of the present invention to provide a new and improved test instrument for use in measuring the amplitude of current and voltage signals.

Another object of the invention is to provide a test instrument for measuring the amplitude of current and voltage pulses at a preselected point along its width dimension.

Still another object of this invention is to provide a digital counting arrangement operative to define the midpoint of an unknown pulse-type signal being measured and to produce a strobe signal for evoking an analog sampling of that signal at a predetermined time following the onset of that signal.

These and other objects and advantages of the invention will become apparent to those skilled in the art from the following detailed description, when considered in connection with the accompanying drawings.

DESCRIPTION OF THE DRAWINGS

FIG. 4 is a logic diagram illustrating a specific implementation of the system indicated by the block diagram of FIG. 3.

DESCRIPTION OF THE PREFERRED EMBODIMENT

Figure 1:
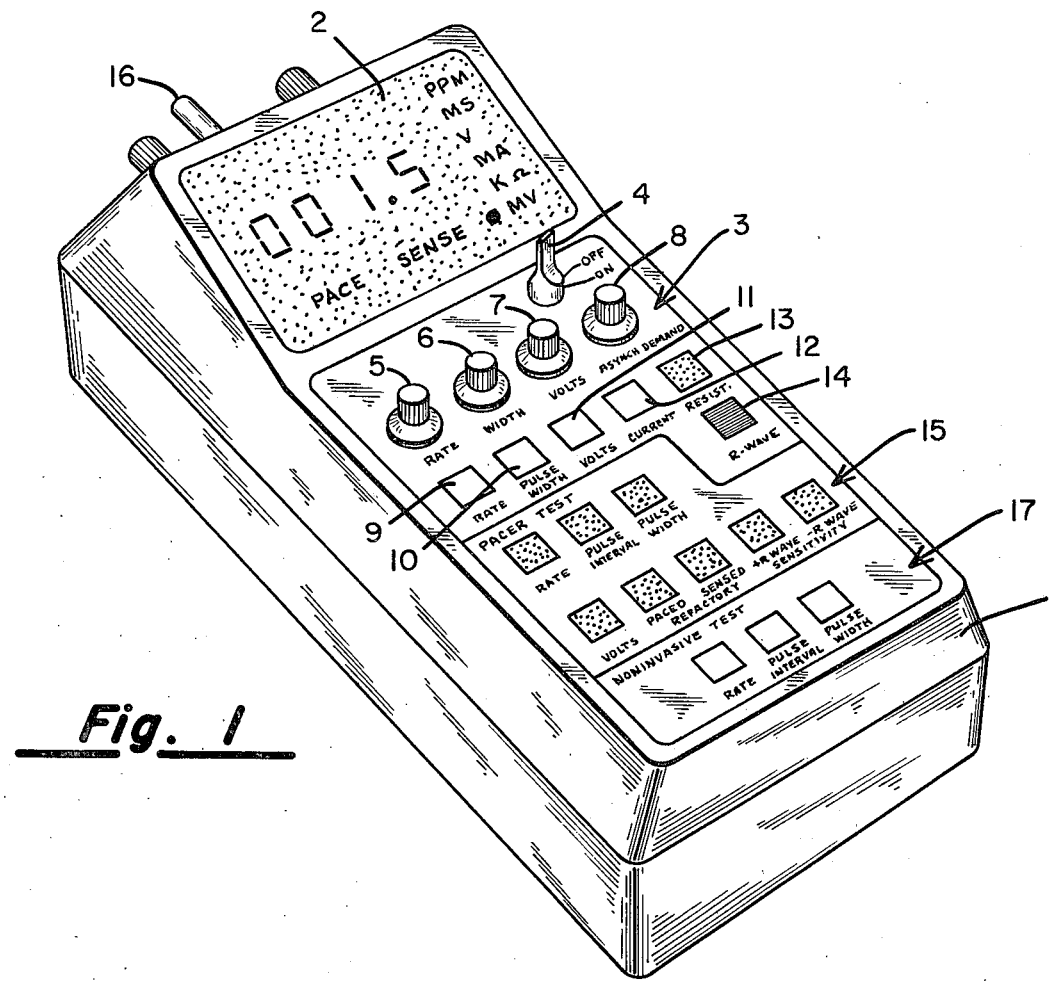
FIG. 1 is a perspective view illustrating the mechanical features of the test instrument of the present invention.

Referring now to FIG. 1, there is shown a perspective view of the test instrument. It includes a case or housing 1 which may be fabricated from a suitable molded plastic and contained within the housing are a number of printed circuit boards including components for implementing the several functions to be described in greater detail hereinbelow. The housing also is adapted to contain a battery power supply for energizing the circuits.

The top surface of the housing is effectively divided into four distinct areas. Specifically, numeral 2 indicates the display area where a visual readout is made available to the user of a plurality of different parameters as dictated by the selection swtiches. The second area of the operator's panel comprises the Threshold Test controls, indicated generally by numeral 3 and specifically including an on-off switch 4 and four potentiometer setting knobs 5-8 which are respectively legended "Rate", "Width", "Volts" and "Sensitivity".

The Threshold Test portion 3 of the keyboard further includes a plurality of push button switches 9, 10, 11 and 12 which, when depressed, become latched to maintain the device in a selected mode even when that push button is released. Push button 9 is legended "Rate" and, when selected, causes a visual readout of the rate at which an internal pulse generator in outputting signals. This value can then be adjusted by use of the rate control knob 5. Similarly, if the push button 10 labeled "Pulse Width" is depressed, it will cause a readout of the width value of the pulses being generated internal to the test device of FIG. 1 and the value may be changed while being observed by manipulating the width knob 6. The voltage and current amplitudes of these pulses may also be displayed and adjusted by manipulating the push buttons 11 and 12 labeled "Volts" and "Current", respectively, and by turning the "Volts" control knob 7.

The push button 13 is legended "Resistance" and, when depressed, results in a calculation of the lead system resistance by continuously sampling the voltage and current values, as measured at the pulse strobe time, and computing the resistance value in accordance with Ohms Law. When used in connection with the testing of implanted pacemakers, the resistance measurement is helpful in assessing the integrity and positioning of the leads.

The push button 14 and the sensitivity knob 8 are used in combination for measuring the amplitude, in millivolts, of the filtered peak-to-peak cardiac R-wave signal. When this measurement is being taken, the rate control knob 5 is rotated in a direction to reduce the rate of the pulses being produced by the test device until the patient's intrinsic rate takes over. Once it is determined that the intrinsic rate is present, the push button 14 is depressed which, as mentioned, causes a digital readout of the amplitude, in millivolts, of the sensed R-waves.

The next major section of the keyboard panel is identified generally by the numeral 15 and is referred to as the Pacer Test portion. It, too, includes a plurality of non-latching push button switches which may be labeled from right to left in the upper row "Rate," "Pulse Interval" and "Pulse Width." The switches in the bottom row may be labeled "Volts," "Paced Refractory," "Sensed Refractory," "+R-wave Sensitivity" and "−R-wave Sensitivity." It is the switches of the pacer test panel 15 that are used in evaluating the performance of a pacemaker device which is to be surgically implanted. In this regard, suitable leads are provided for connecting the pacer under test "not shown" to the jack 16 disposed on the top of the housing 1. By proper manipulation of the various push buttons indicated, it is possible to measure the performace parameters of the pacer device under test and display the results of the display screen 2.

Disposed toward the bottom of the operator's panel is is the fourth major section referred to as the Non-invasive Test portion and identified generally by numeral 17. The three push button switches located in this portion of the panel are legended "Rate," "Pulse Interval" and "Pulse Width," respectively, and are used when it is desired to test the performance of an implanted pacer pulse generator on a non-invasive basis. When operating in this mode, electrical leads are coupled between the plug 18 and suitable electrodes positioned on the skin surface of the patient.

Now that the overall mechanical featues of the test instrument have been set forth, consideration will be given to its overall electronic construction and, in this regard, the general block diagram of FIG. 2 will be referred to.

The internal operation of the test device originates from the keyboard (function select) 20 in conjunction with the Control Logic 21. After a particular function selection has been made, the Control Logic 21 illuminates the appropriate measurement unit located on the dispaly panel 2 to FIG. 1, thereby indicating which measurement is in progress.

As mentioned, the test device of the present invention includes three functionally independent sections, namely, Threshold Test, Pacer Test and Non-invasive Test. Each separate section is contained within the same housing and powered by the same battery but has a separate function selection control area 3, 15 or 17, on the control panel. The logic is arranged such that measurements which are common to more than one feature, i.e., rate interval, width and amplitude (voltage) measurements, have a function selection control in each applicable device control area but the electronic circuitry involved is common to each.

The selection of a particular measurement of operation of one of the push button switches initiates a signal which identifies the particular device mode selected. This signal travels to the Signal Conditioner 22 where it is processed. The Signal Conditioner 22 forwards the required signals to the appropriate circuitry which initiates the selected measurement.

The test device of the present invention operates on a basic clock frequency established by the crystal oscillator 23 and may, for example, be a 1.0 megahertz pulse train. Various frequency dividers are employed which receive the signals originating at the crystal oscillator 23 for producing other stable clock signals at predetermined reduced frequencies.

As will be set out in greater detail hereinbelow, all measurements made by the device, except refractory and sensitivity measuremens in the Pacer Test mode, up-date continuously while a measurement push button is depressed or latched. The manner in which the Display Counter 24 is tied in with the rest of the logic permits this to be done. Specifically, while the initial measurement is being displayed, the remaining measurement circuitry contained within the device can initiate a second measurement cycle. The Display counter 24 retains the first measurement information and makes it available to the Digital Display 25 until such time as the second measurement has been completed and forwarded to the display counter. This updating cycle continues until another measurement is selected.

With the foregoing general background in mind, when a push button in the Threshold Test portin 3 of the control panel is depressed, the Signal Contioner 22 interprets the device mode in operation and forwards the required signals to the proper circuitry to initiate a measurement. The four control dials 5-8 operate through variable resistors to provide adjustment capabilities for rate, width, amplitude and sensitivity parameters. To facilitate parameter adjustment, the associated push bottons for all variable parameters, i.e., rate, pulse width, amplitude (volts) and the resultant current, are latched by the keyboard circuit 20 and held until a different one of the plural keys is operated.

The test device of the present invention includes its own internal pulse generator which may be used to provide pacing to a patient during surgical procedures while efforts are underway to install a implantable pacer. The pulse generator of the test instrument of FIG. 1 operates in either an asynchronous or adjustable demand mode. The rotation of the sensitivity control dial 8 to a desired demand setting places a threshold voltage on a comparator. If the intrinsic R-wave amplitude exceeds this voltage threshold, the device's pulse generator senses the R-wave and resets the pulse-to-pulse interval. This procedure allows continuous demand operation.

As is more fully set in the co-pending application of Scott W. Carlson, entitled INTERVAL-TO-RATE CONVERTER, filed concurrently herewith, for a rate measurement, the device of the present invention digitally measures the pulse-to-pulse time interval via the Interval and Width Measurements 26. This interval information is then applied to the Interval-to-Rate conversion circuit 27 which converts the interval data (measured in milliseconds) to rate data (measured in pulses per minute). The output from the Interval-to-Rate conversion circuit 27 is applied to the display counter which provides the Digital Display 25 with the proper measurement value initiating a display readout operation.

For a pulse width measurement, the Signal Conditioner 22 provides a gate signal to the Interval and Width Measurement circuitry 26. This latter circuitry sends the gated clock signal to the Display Counter 24. The Display Counter counts the pulses and provides the information to the Digital Display which initiates the readout of the interval information.

For voltage, current and resistance measurements, the Signal Conditioner 22 is used to determine the point in the pulse where sampling is to occur and provides a strobe pulse to the Analog Measurement circuitry 28. The output of the appropriate analog circuitry is then applied to the Analog-to-Digital Converter 29 which, in turn, outputs the proper measurement information to the Digital Display 25. In that the present invention is concerned principally with the manner in which analog measurements are obtained at a time instant which is at a preselected distance from the leading edge of a pulse, e.g., at its midpoint, considerably more detail relating to this feature will be set out hereinbelow. However, this introductory material is intended to provide the reader with an understanding of the overall environment in which the present invention finds application.

With this in mind, it is pointed out that voltage information is obtained directly from the device's pulses at a predetermined point regardless of the width of those pulses. Current information is determined by measuring the voltage drop, in series with the output, across a small resistor. Resistance is calculated in an analog divider on the basis of Ohm's Law.

Continuing then with a general discussion of the overall organization of the device, for an intrinsic R-wave measurement, the device measures the peak-to-peak voltage of the QRS complex while the device's pulse generator is inhibited. When measuring peak-to-peak voltage, the Signal Conditioner 22 filters the R-wave through a bandpass filter of the pulse generator. The Signal Conditioner transmits the resulting data to the R-wave measurement circuitry 30 where peak-to-peak amplitude (voltage) is determined and stored. The measurement circuitry 30 applies the information to the A/D converter 29 which, then, determines the actual amplitude and forwards the digital information onto the Digital Display 25 for presentation.

As was mentioned above, the device of the present invention is also arranged to test the operating parameters of an external pulse generator such as a cardiac pacer device prior to its implantation. When a push button in the pacer test section 15 (FIG. 1) is depressed, the Signal Conditioner 22 interprets the device mode in operation and forwards the required signals to the proper circuitry to initiate a measurement. Rate, pulse width and amplitude (volts) measurements are common to the Threshold Test section already described and the Pacer Test. The equipment has been designed to eliminate redundancy such that the same circuitry performs the measurements in both device modes. The measurement methods are identical except, during the Pacer Test mode, the signal source originates from the external pacer's pulse generator rather than from the pulse generator which is built into the test device itself.

In addition to the rate, pulse width and amplitude measurements, the device measures and displays the pulse-to-pulse interval in milliseconds. To measure the interval, the Signal Conditioner 22 generates a gate signal. The gate signal is then combined with a clock source in the Interval and Width measurements circuitry 26 causing a burst of clock pulses to occur during the described interval. The clock pulses are fed into the Display Counter 24 which counts them and provides the digital display 25 with the proper information.

For paced and sensed refractory measurements of external or implantable pulse generators, the Refractory Measurement circuitry 31 initially measures a pulse-to-pulse reference interval. After each pulse generator pulse, the Signal Conditioner 22 emits simulated R-waves to the pulse generator in a sequence designed to determine the refractory period in the minimum number of cycle replications possible. For paced refractory measurements, this sequence begins after the pulse generator outputs a paced pulse. For sensed refractory measurements, a simulated R-wave is emitted typically, 600 milliseconds after a paced pulse to initiate a second pulse. This 600 millisecond extension is included in the total pacer pulse reference interval. After the initiation of a sensed pulse, simulated R-waves are emitted in the identical sequence as was described for paced refractory measurements. A time extension of the pulse-to-pulse interval indicates that the pulse generator under test has sensed the simulated R-wave and has reset the refractory period. When a 10 millisecond time increase between simulated R-wave emissions results in a pulse-to-pulse extension, the Refractory Measurement circuitry 31 calculates the value and initiates a clock burst. The clock burst is fed to the Display Counter 24 for later utilization by the Digital Display 25.

To measure positive and negative sensitivities, the Signal Conditioner 22 may emit a 22 Hz half-sine waveform at the 0.1 millivolt amplitude level 600 milliseconds after a paced pulse. Circuit 22 then continuously emits simulated R-waves at 600 ms intervals, increasing the R-waves by 0.1 millivolt increments each time a paced pulse is detected. When the pulse generator under test inhibits, the Sensitivity Measurement circuit 32 applies a value corresponding to the number of increments required to inhibit the pulse generator to the Display Counter 24. The Display Counter supplies the data on the Digital Dispay 25 which activates a display readout. Positive and negative sensitivities are measured identically, except that the simulated R-waves differ in polarity. Specifics of the construction and operation of the R-wave sensitivity measuring circuitry of the test device described herein may be obtained by reading the co-pending application of James T. Bartelt, and entitled Cardiac Pacer Testing System, filed concurrently herewith.

The push buttons contained in the Non-invasive portion 17 of the control panel can be used to determine the rate, pulse interval and pulse width of an implanted pacemaker system. When the test device of FIG. 1 is functioning in this mode, the Signal Conditioner 22 detects electrical activity on the skin's surface. The Signal Conditioner filters this information, deriving the various gate signals required to determine the information.

Rate, pulse interval and pulse width measurements are common to the Threshold Test, Pacer Test and Non-invasive Test sections. Therefore, after the Signal Conditioner determines the gate signals, the same circuitry employed during Threshold Test and Pacer Test operation performs the appropriate measurement and feeds the data to the display 25 in an identical manner.

Figure 2:
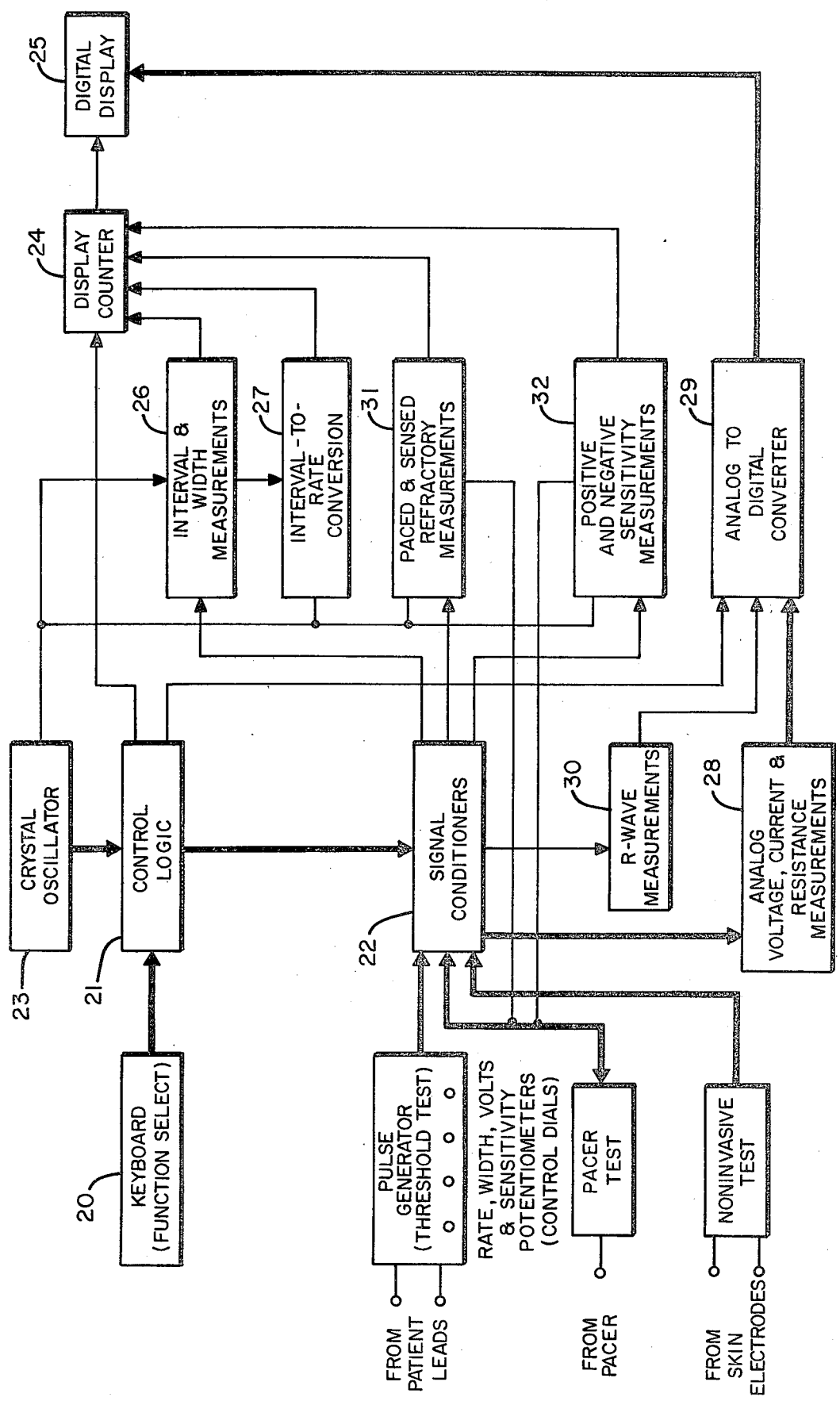
FIG. 2 is a general block diagram of the overall test instrument.

In that the present invention is concerned with the manner in which analog measurements are obtained at a precise point along the width of a pulse signal, the circuitry involved in this aspect are shown in FIG. 2 as being interconnected by heavier weight lines to thereby highlight the signal paths involved.

Figure 3:
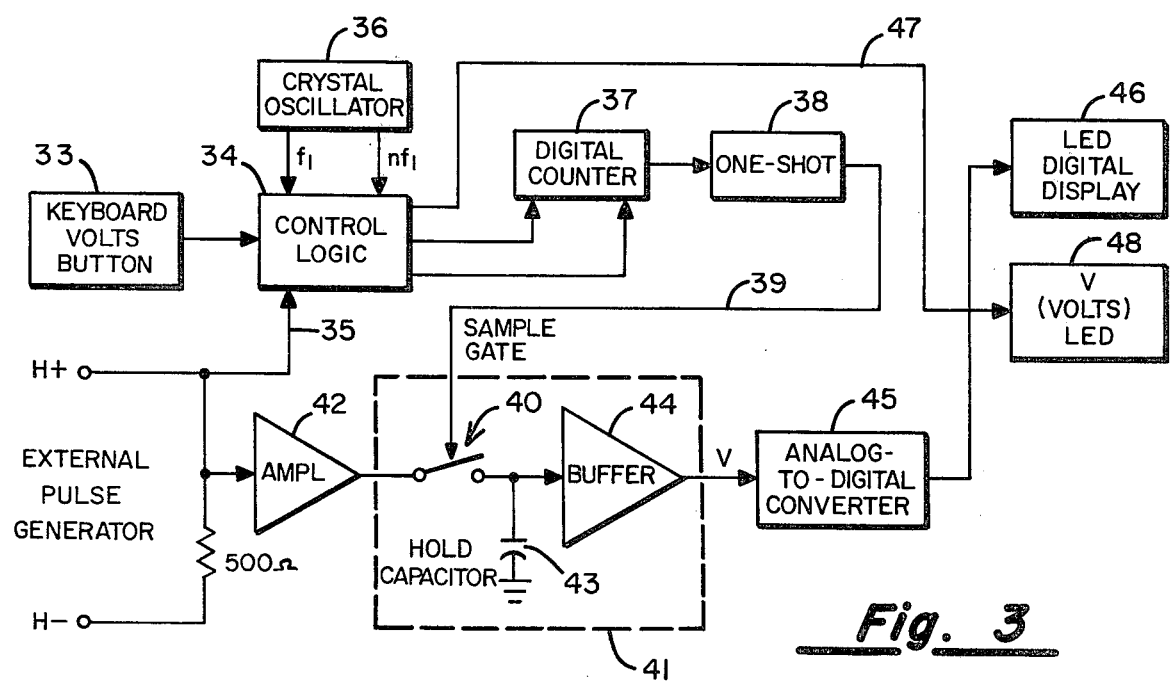
FIG. 3 is a block diagram showing the manner in which the midpoint measuring feature may be implemented.

Referring next to FIG. 3, an explanation will be presented as to the overall operation of the analog measuring apparatus whereby the current voltage amplitudes of variable width pulses can be measured precisely at a predetermined time. The circuitry will be described in connection with implementing an arrangement whereby measurements are obtained precisely at the midpoint of a pulse type waveform, it being understood, however, that the measurement may just as well be taken at other time references within the pulse width under test. When the parameter being measured is the voltage amplitude of the pulse input, the operator depresses either the push button labeled "Volts" in the Threshold Test section 3 or the Pacer Test section 15 of the operator's keyboard in FIG. 1. This operation is represented by box 33 in the block diagram of FIG. 3. The resulting signal from the keyboard is applied to the control logic 34 along with the pulse signal from the external pacer pulse generator under test or from the internal pulse generator of the test device itself. This pulse signal is applied to the control logic by way of line 35. Also applied to the control logic is the output from a crystal oscillator time base generator 36. As is indicated in FIG. 3, clock signals of a frequency $f_1$ and $n f_1$ (where n is an integer) are also applied to the control logic. As will become apparent, it is the value of the integral number, n, which determines the location along the width of the pulse arriving by way of line 35 where the amplitude measurement is taken. For purposes of explanation, assume that the measurement is to be taken at the precise midpoint of the applied pulse. With this assumption, the crystal oscillator 36 may present clock signals of a first frequency, eg., 100 KHz, and of twice that frequency (200 KHz).

The control logic functions to first cause a digital counter device such as 37 to first count up the 100 KHz clock pulse occurring during the entire interval of the received pulse on line 35 and subsequently to count down this value at the higher rate, i.e., 200 KHz. When the contents of the counter 37 reach zero, a signal is applied to a one-shot circuit 38 which outputs a strobe pulse of a predetermined duration on line 39 to the sample gate 40 of a sample and hold circuit shown enclosed by dashed line box 41. It is apparent, then, that if the counter 37 uses 100 KHz clock pulses to intially measure the total interval of the pulse to be measured on line 35 and subsequently uses twice that frequency to count down the binary number corresponding to this interval, that the output from the one-shot 38 will occur at the exact midpoint of that interval.

The voltage amplitude of the pulse on line 35 is continually sampled by a operational amplifier circuit 42 whose output is coupled to the sample and hold circuit 41. Hence, when the strobe signal appears on line 39 at the midpoint of the pulse interval the amplitude being measured will be stored on the hold capacitor 43 when the strobe pulse terminates. This analog voltage is coupled through a buffer circuit 44 to the input of an analog-to-digital converter circuit 45 which converts the analog value to a digital number for ultimate transmission to a LED-type digital display device 46. The depression of the "Volts" button on the keyboard 33 operates through the control logic 35 to also produce a signal on line 47 for illuminating a LED 48 associated with the legend marked "V" on the face of the display screen 2 so that the operator will know the units for the digital value also displayed on the screen.

Apparatus for implementing the digital counter 37, the one-shot circuit 38 and a portion of the control logic 34 is set forth in the logic diagram of FIG. 4. Specifically, there is shown a binary up-counter which may, for example, include 12 stages for registering a value entered therein by way of the clock input terminal (CLK). Connected to this input terminal is the output of an AND gate 50 having as one of the inputs thereto the output from a source of regularly occurring clock signal, e.g., a 100 KHz source, via conductor 51. The other input to gate 50 comes from the output of a second coincidence gate 52 which also has a pair of inputs. A first input of gate 52 comes from the keyboard circuit which carries a logic level signal for partially enabling the gate 52 whenever an analog-type measurement is called for. The second input to the gate 52 is derived from the pacer pulse whose amplitude is to be measured. In can be seen, then, that when an appropriate key switch on the control panel is depressed and either a paced pulse from an external pulse generator or from the internal pulse generator is applied to the gate 52, the pacer pulse will be transmitted and will serve as an enable for the gate 50. As such, 100 KHz clock pulses will be applied to the up-counter and will be accumulated therein. At the onset of a first pacer pulse, the one-shot circuit 53 is triggered to apply an Asynchronous Preload Enable signal (APE) to a downcounter comprised of two integrated circuit 54 and 55 which are cascaded to form a single twelve-bit downcounter. The inputs to the downcounter are coupled to the outputs from the up-counter 49. Hence, upon receipt of the APE control signal, the contents of the counter 49 are jammed into the downcounter.

The downcounter is arranged to be decremented by the output from AND gate 56. This gate, when enabled by the output from a further AND gate 57, allows the 200 KHz clock pulses to pass through gate 56 to thereby decrement the downcounter 54–55. Gate 57 is enabled by the depressed keyboard switch and by alternate ones of received pacer pulses. That is to say, gate 52 and 57 are arranged to receive pace pulses from the device being tested on an alternating basis by a circuit controlled from a toggle-type flip-flip (not shown). It is deemed to be well within the realm of ordinary skill to realize such a logic configuration for alternately applying successive pulses to two separate lines.

The carry output from the downcounter circuit 54 is coupled to the clock input of a D-type flip-flop 58 whose D-input is tied to ground. The Q output of the flip-flop is coupled to a first input of a NOR gate 59 whose second input is also tied to the C.O. terminal of the downcounter chip 54. The output from NOR gate is applied by way of an inverter 60 to the clock enable (C.E.) terminal of the chip 55. Hence, when the clip 54 is counted down to zero by the 200 KHz clock pulses, the flip-flip 58 is clocked to its zero state thereby applying the appropriate binary signal to the C.E. terminal of the integrated circuit downcounter chip 55 to permit it to be decremented by the clock signals applied to it by way of the conductor 61.

The C.O. output of the downcounter chip 55 is connected to an input of a one-shot circuit 62 which is arranged to develop a narrow strobe signal of a predetermined width each time it is triggered. A narrow pulse of, say 20 microseconds duration is found to be workable. This signal appears on the line labeled "Sample" and is used to activate the Sample and Hold circuit mentioned above. The output obtained from the Q terminal of one-shot circuit 62 is applied to the clear (CLR) terminals of the counter chips 54 and 55 to ensure that they are reset each time a strobe pulse is generated. This readies these couters for receipt of a subsequent dump from the up-counter circuits 49.

It should be apparent, then, that by properly selecting the clock rates to be applied to the gates 50 and 56, one may precisely select the location along the width of a pulse being analyzed where the strobe signal is to be generated. As was already mentioned, by arranging the clock frequency such that the signals applied to the gate 56 are twice that applied to the gate 50, the strobe will occur at the precise midpoint of the pulse being analyzed.

Those skilled in the art will recognize that various changes and modifications may be made to the circuit implementation which has been set out herein as an exemplary embodiment while not really departing from the inventive concepts described. Accordingly, the scope of the invention is to be determined from the following claims.

What is claimed is:

1. Electronic test apparatus for measuring the voltage amplitude of a pulse type waveform at a predetermined time following the leading edge thereof, comprising:
   (a) a first source of regularly occurring timing signals of a frequency, $f_1$;
   (b) a second source of regularly occurring timing signals of a frequency, $n\,f_1$;
   (c) counter means connected to be incremented by said timing signals of frequency $f_1$ which occur during the duration of the pulse to be measured and to be decremented by said timing signals of frequency $n\,f_1$ during the duration of a subsequently occurring one of said pulses to be measured;
   (d) strobe signal generating means for detecting when the count in said counter means reaches a predetermined value and for generating a strobe signal when said predetermined value is reached;
   (e) means coupled to receive said strobe signal for sampling the voltage amplitude of said pulse to be measured at the time of occurrence of said strobe signal; and
   (f) means for displaying a value corresponding to the amplitude so sampled.

2. The apparatus as in claim 1 wherein n is an integer.

3. The apparatus as in claim 2 wherein $n=2$.

4. Apparatus as in claim 1 wherein said counter means comprises:
   (a) a binary up-counter adapted to be advanced by said timing signals of a frequency $f_1$ occurring during the duration of the pulse to be measured;
   (b) a binary presettable downcounter having a plurality of stages coupled to receive the output from said up-counter upon receipt of a gating pulse, said downcounter adapted to be decremented by said timing signals of said frequency $n\,f_1$ occurring during a subsequent indentical duration of the pulse to be measured; and
   (c) means responsive to the occurrence of one of said pulses to be measured for producing said gating pulse.

5. Apparatus as in claim 4 wherein said strobe signal generating means is coupled to reset said binary presettable downcounter.

6. Apparatus as in claim 1 wherein said means for displaying comprises:
   (a) analog-to-digital converter means coupled to said means for sampling for producing a digital number corresponding to the amplitude so sampled;
   (b) digital number registering means connected to receive said digital number; and
   (c) visual display means connected to said digital number registering means.

7. Apparatus as in claim 4 wherein said strobe signal generating means comprises:
   (a) a monostable multivibrator having its trigger input connected to the carry output terminal of said presettable downcounter.

* * * * *